(12) United States Patent
Boudreau et al.

(10) Patent No.: US 12,040,597 B2
(45) Date of Patent: Jul. 16, 2024

(54) SEMICONDUCTOR LASERS WITH IMPROVED FREQUENCY MODULATION RESPONSE

(71) Applicant: TeraXion Inc., Québec (CA)

(72) Inventors: Sylvain Boudreau, Saint-Augustin-de-Desmaures (CA); Keven Bédard, Québec (CA); Michel Morin, Québec (CA); François Costin, Saint-Augustin-de-Desmaures (CA); André Babin, Québec (CA); Simon Ayotte, Saint-Augustin-de-Desmaures (CA)

(73) Assignee: TERAXION INC., Quebec (CA)

( * ) Notice: Subject to any disclaimer, the term of this patent is extended or adjusted under 35 U.S.C. 154(b) by 130 days.

(21) Appl. No.: 17/384,135

(22) Filed: Jul. 23, 2021

(65) Prior Publication Data
US 2022/0123526 A1    Apr. 21, 2022

Related U.S. Application Data

(60) Provisional application No. 63/055,483, filed on Jul. 23, 2020.

(51) Int. Cl.
*H01S 5/32*     (2006.01)
*H01S 5/065*    (2006.01)
*H01S 5/125*    (2006.01)

(52) U.S. Cl.
CPC .............. *H01S 5/32* (2013.01); *H01S 5/0655* (2013.01); *H01S 5/125* (2013.01)

(58) Field of Classification Search
CPC ....................... H01S 5/06256; H01S 5/06258
See application file for complete search history.

(56) References Cited

U.S. PATENT DOCUMENTS 5,170,402 A    12/1992    Ogita et al.
8,167,208 B2    5/2012    Weitzner et al.
(Continued)

FOREIGN PATENT DOCUMENTS

GB    2437784    11/2007
WO    WO-2020140286 A1 *  7/2020    ............. H01S 5/026

OTHER PUBLICATIONS

Okai, M. et al. Corrugation-Pitch-Modulated Phase-Shifted DFB Laser. IEEE Photonics Technology Letters, vol. 1, No. 8, Aug. 1989 (Year: 1989).*

(Continued)

*Primary Examiner* — Minsun O Harvey
*Assistant Examiner* — Stephen Sutton Kotter
(74) *Attorney, Agent, or Firm* — Barnes & Thornburg LLP

(57) ABSTRACT

A semiconductor laser comprising a single mode laser cavity having a stack of semiconducting layers defining a transversal p-n junction is provided. A plurality of electrodes are coupled to corresponding sections of the laser cavity along the longitudinal light propagation direction, each corresponding section defining one of an amplification section or a modulation section. One or more DC sources are coupled to the electrodes associated with the amplification sections to forward-bias the p-n junction above transparency, so as to provide gain in the associated amplification sections. One or more modulation signal sources are coupled to the electrodes associated with the modulation sections, and apply a modulation signal across the p-n junction below transparency, the modulation signal providing a modulation of an output optical frequency of the semiconductor laser. Each modulation section is operated in photovoltaic mode.

32 Claims, 12 Drawing Sheets

(56) References Cited

U.S. PATENT DOCUMENTS

| | | | | |
|---|---|---|---|---|
| 2004/0091009 | A1* | 5/2004 | Matsuda | H01S 5/0601 |
| | | | | 372/45.013 |
| 2004/0218639 | A1 | 11/2004 | Oh et al. | |
| 2006/0088066 | A1 | 4/2006 | He | |
| 2016/0006509 | A1* | 1/2016 | Blauvelt | H04B 10/2575 |
| | | | | 398/115 |
| 2018/0076595 | A1* | 3/2018 | Honda | H01S 5/02446 |

OTHER PUBLICATIONS

Tohyama, Masaki et al. Mechanism of Tuning and Frequency Modulation in Three-Electrode DFB Lasers. IEEE Journal of Selected Topics in Quantum Electronics, vol. 1, No. 2, Jun. 1995 (Year: 1995).*

Yoshikuni, Yuzo et al. Multielectrode Distributed Feedback Laser for Pure Frequency Modulation and Chirping Suppressed Amplitude Modulation. Journal of Lightwave Technology, vol. LT-5, No. 4, Apr. 1987.

Vahala, Kerry. J. et al. The optical gain lever : A novel gain mechanism in the direct modulation of quantum well semiconductor lasers. Appl. Phys.Lett. 54, 2506 (1989): doi: 10.1063/1.101076.

Okai, M, et al. Corrugation-Pitch-Modulated Phase-Shifted DFB Laser. IEEE Photonics Technology Letters, vol. 1, No. 8, Aug. 1989.

Ogita, S. et al. FM Response of Narrow-Linewidth, Multielectrode λ/4 Shift DFB Laser. IEEE Photonics Technology Letters, vol. 2, No. 3, Mar. 1990.

Burrows, E.C et al. High Resolution Laser Lidar Utilising Two-Section Distributed Feedback Semi-Conductor Laser as a Coherent Source. Electronic Letters, Apr. 26, 1990, vol. 26, No. 9.

Lau, K.Y. Frequency modulation and linewidth of gain-levered two-section single quantum well lasers. Applied Physics Letters 57, 2068 (1990); doi: 10.1063/1.103943.

Okai, M. et al. Corrugation-Pitch-Modulated MQW-DFB Laser with Narrow Spectral Linewidth (170 kHz). IEEE Photonics Technology Letters, vol. 2, No. 8, Aug. 1990.

Goobar, Edgard et al. Characterization of the Modulation and Noise Properties of a Three-Electrode DFB Laser. IEEE Photonics Technology Letters, vol. 4, No. 5, May 1992.

Okai, M. et al. Tunable DFB Lasers With Ultra-Narrow Spectral Linewidth. Electronics Letters Feb. 18, 1993 vol. 29, No. 4.

Tohyama, Masaki et al. Wavelength Tuning Mechanism in Three-Electrode DFB Lasers. IEEE Photonics Technology Letters, vol. 5, No. 6, Jun. 1993.

Okai, M. et al. Strained multiquantum-well corrugation-pitch-modulated distributed feedback laser with ultranarrow (3.6kHz) spectral linewidth. Electronics Letters Sep. 16, 1993, vol. 29, No. 19.

Hong J. et al. Static and dynamic characteristics of MQW DFB lasers with varying ridge width. IEEE Proc.-Optoelectron, vol. 141, No. 5, Oct. 1994.

Nilsson, Stefan et al. Improved Spectral Characteristics of MQW-DFB Lasers by Incorporation of Multiple Phase-Shifts. Journal of Lightwave Technology, vol. 13, No. 3, Mar. 1995.

Tohyama, Masaki et al. Mechanism of Wavelength Tuning and Frequency Modulation in Three-Electrode DFB Lasers. IEEE Journal of Selected Topics in Quantum Electronics, vol. 1, No. 2, Jun. 1995.

Karlsson, Christer J et al. Linearization of the Frequency Sweep of a Frequency-modulated Continuous-Wave Semiconductor Laser Radar and the Resulting Ranging Performance. Applied Optics, vol. 38, No. 15, May 20, 1999.

Coldren L.A. et al. Diode Lasers and Photonic Integrated Circuits 2nd ed. John Wiley & sons (2012).

Pierrottet, Diego et al. Linear FMCQ Laser Radar for Precision Range and Vector Velocity Measurements. Coherent Applications, Inc., Hampton VA, 23669 and NASA Langley Research Center, Hampton VA 23681.

International Search Report corresponding to PCT/CA2021/051018 dated Nov. 1, 2021.

Extended European Search Report issued in Appl. No. EP21845342.1 (Jan. 8, 2024).

* cited by examiner

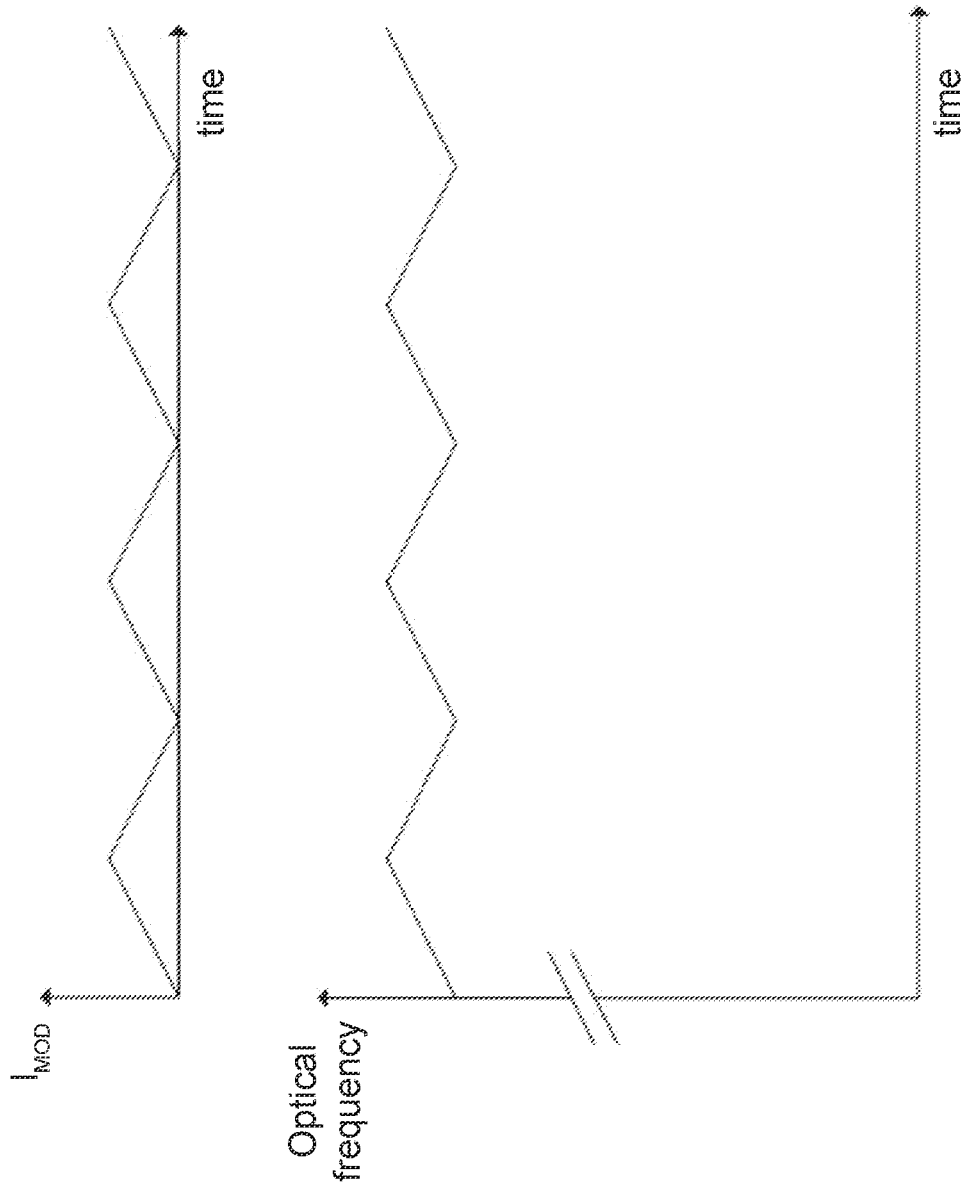

SEMICONDUCTOR LASERS WITH IMPROVED FREQUENCY MODULATION RESPONSE

RELATED PATENT APPLICATION

The present application claims priority to U.S. Provisional Patent Application No. 63/055,483 filed on Jul. 23, 2020, the disclosure of which is incorporated herein by reference in its entirety.

BACKGROUND

Semiconductor laser diodes are the most efficient, compact and cost-effective laser sources available, attributes that make them highly desirable for numerous applications. They are driven directly by an electrical current and can be modulated at high speeds.

An advantageous feature of semiconductor lasers is their tunability. Varying the current applied to a semiconductor laser leads to a change in the index of refraction of the semiconductor material. This modifies the resonance condition within the laser cavity and a shift in the optical frequency of light emitted by the laser occurs. Typically, the laser is driven by a continuous current to which is added a relatively weak current variation, either to tune its output optical frequency or to modulate this optical frequency.

The relationship between the modulation of the drive current of a semiconductor laser and the ensuing modulation of the optical frequency of the output laser beam depends on the Frequency Modulation (FM) response of the laser. Non-uniformities in the FM response of the laser can lead to unwanted distortions of the optical frequency of the output light beam.

There remains a need for a laser with an improved control of the FM response.

SUMMARY

In accordance with one aspect, there is provided a semiconductor laser, comprising:
  a single mode laser cavity comprising a stack of semiconducting layers defining a transversal p-n junction and having a longitudinal light propagation direction;
  a plurality of electrodes each coupled to a corresponding section of the laser cavity along the longitudinal light propagation direction, each corresponding section defining one of an amplification section or a modulation section;
  one or more DC sources each coupled to the electrodes associated with said amplification sections and operable to forward-bias the p-n junction above transparency so as to provide gain in the associated amplification sections; and
  one or more modulation signal sources each coupled to the electrodes associated with said modulation sections and operable to apply a modulation signal across said p-n junction below transparency, the modulation signal providing a modulation of an output optical frequency of the semiconductor laser;
wherein each modulation section is operated in photovoltaic mode.

In some implementations, the single mode laser cavity comprises a substrate supporting the stack of semiconductor layers, and the stack of semiconductor layers comprises, along a first direction transversal to the light propagation direction:
  one or more contiguous p-doped layers;
  one of more contiguous n-doped layers; and
  one of more contiguous active layers extending between the p-doped layers and the n-doped layers.

In some implementations, the stack of semiconducting layers has an index of refraction profile along the first direction configured to provide guiding for an optical mode with a maximum optical intensity close to the active layers.

In some implementations, the single mode laser cavity comprises a confinement structure in a second direction perpendicular to the first direction and to the light propagation direction, the confinement structure being configured to confine light and current along the second direction.

In some implementations, the single mode laser cavity further comprises a reflective structure configured to provide optical feedback along the light propagation direction. The reflective structure may be arranged in one of a distributed feedback configuration and a distributed Bragg reflector configuration. The reflective structure may comprise a distributed Bragg grating comprising a plurality of periodic corrugations along the light propagation direction. The distributed Bragg grating may comprise a $\pi$ phase shift. In some implementations, the periodic corrugations have a period that varies along the light propagation direction.

In some implementations, the one or more DC sources comprises at least one DC current source configured to inject a DC current across the p-n junction in the amplification sections.

In some implementations, the one or more modulation sources comprise at least one AC current source configured to inject a modulated current across the p-n junction in the modulation sections. The modulated current may differ from one modulation section to another.

In some implementations, the one or more modulation sources comprise at least one AC voltage source applying a modulated voltage across the p-n junction in the modulation sections.

In some implementations, the semiconductor laser further comprises, in association with each modulation section, a photovoltaic mode element connected to the corresponding electrode.

In some implementations, the photovoltaic mode element comprises a load resistor. The load resistor may have an adjustable resistance value. In some implementations, the semiconductor laser further comprises an electronic circuit configured to measure a voltage and a current across the load resistor and to produce a signal to adjust the resistance value of the load resistor.

In some implementations, the photovoltaic mode element comprises a DC voltage source.

In some implementations, the photovoltaic mode element comprises a DC current source.

In some implementations, the semiconductor laser comprises a single modulation section.

In some implementations, the semiconductor laser comprises a single amplification section.

In some implementations, the semiconductor laser comprises at least two amplification sections.

In accordance with one aspect, there is provided a semiconductor laser. The semiconductor laser includes a single mode laser cavity comprising a stack of semiconducting layers defining a transversal p-n junction and having a longitudinal light propagation direction. The semiconductor laser further includes a plurality of electrodes, each coupled to a corresponding section of the laser cavity along the longitudinal light propagation direction, each corresponding section being one of an amplification section or a modulation section. At least one DC source is provided, each coupled to the electrode associated with one of said amplification sections, and operable to forward-bias the p-n junction above transparency so as to provide gain in the associated amplification section. The semiconductor laser further includes at least one modulation signal source, each coupled to the electrode associated with one of said modulation sections, and operable to apply a modulation signal across said p-n junction below transparency. The modulation signal is selected to provide a modulation of an output optical frequency of the semiconductor laser. Each modulation section is operated in photovoltaic mode.

Other features and advantages of the invention will be better understood upon reading of embodiments thereof with reference to the appended drawings.

BRIEF DESCRIPTION OF THE DRAWINGS

FIG. 9A illustrates a triangular modulation signal according to one embodiment; FIG. 9B illustrates the optical frequency response associated with the triangular modulation signal of FIG. 9A.

DETAILED DESCRIPTION

Figure 1:
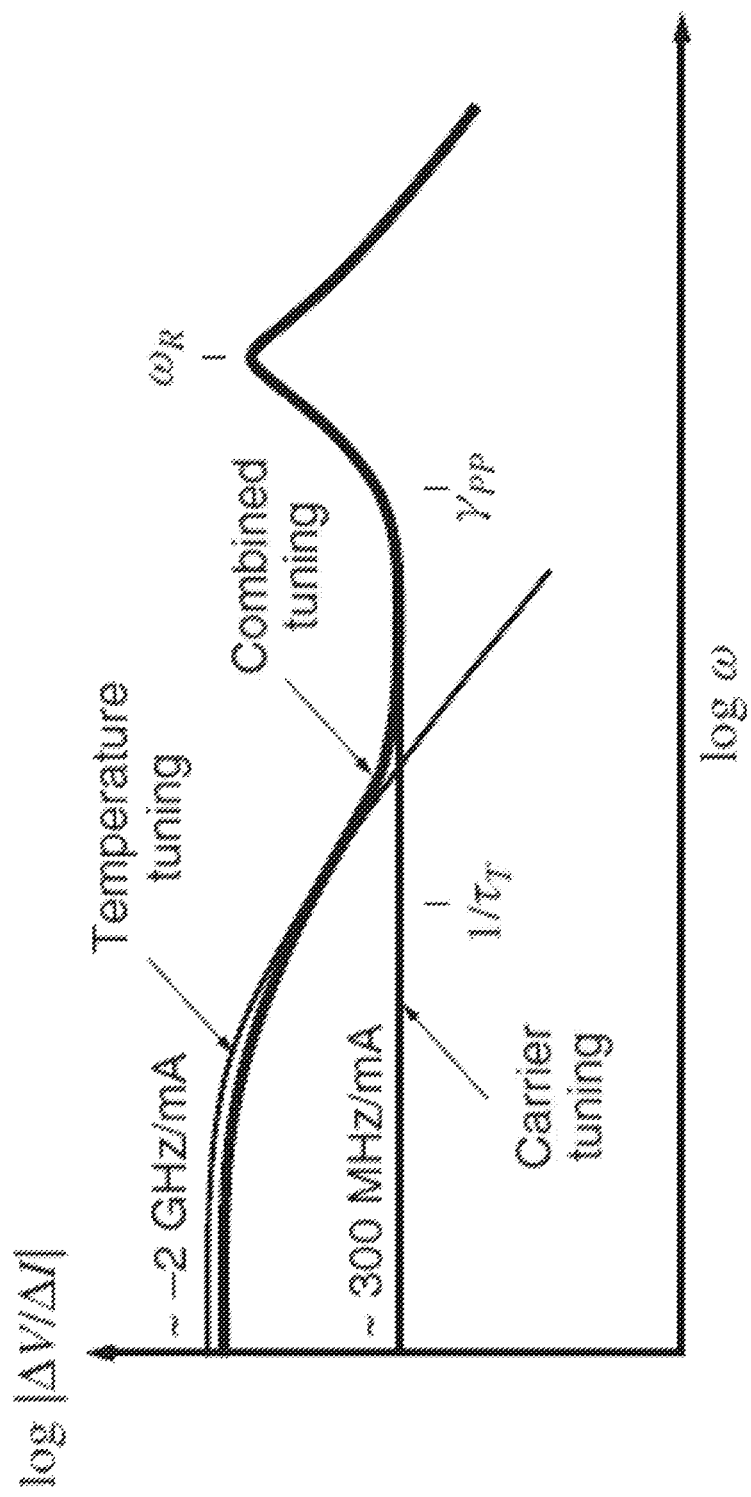
FIG. 1 is a graph illustrating the typical frequency behaviour of the amplitudes of the thermal and carrier FM responses of a semiconductor laser.

The present description generally concerns a single mode multi-electrode semiconductor laser having an improved FM response flatness relatively to that achievable with the prior art.

In the following description, similar features in the drawings have been given similar reference numerals. In order not to unduly encumber the figures, some elements may not be indicated on some figures if they were already mentioned in preceding figures. It should also be understood herein that the elements of the drawings are not necessarily drawn to scale and that the emphasis is instead being placed upon clearly illustrating the elements and structures of the present embodiments.

The terms "a", "an" and "one" are defined herein to mean "at least one", that is, these terms do not exclude a plural number of items, unless stated otherwise. Terms such as "substantially", "generally" and "about", that modify a value, condition or characteristic of a feature of an exemplary embodiment, should be understood to mean that the value, condition or characteristic is defined within tolerances that are acceptable for the proper operation of this exemplary embodiment for its intended application.

Unless stated otherwise, the terms "connected" and "coupled", and derivatives and variants thereof, refer herein to any structural or functional connection or coupling, either direct or indirect, between two or more elements. For example, the connection or coupling between the elements may be mechanical, optical, electrical, logical, or any combination thereof.

In the present description, the terms "light" and "optical", and variants and derivatives thereof, are used to refer to radiation in any appropriate region of the electromagnetic spectrum. The terms "light" and "optical" are therefore not limited to visible light, but can also include, without being limited to, the infrared or ultraviolet regions of the electromagnetic spectrum. Also, the skilled person will appreciate that the definition of the ultraviolet, visible and infrared ranges in terms of spectral ranges, as well as the dividing lines between them, may vary depending on the technical field or the definitions under consideration, and are not meant to limit the scope of applications of the present techniques.

Theoretical Context

When varying the current applied to a semiconductor laser, two mechanisms take place that alter its index of refraction. A current increase produces an increase in temperature with a concomitant increase in the index of refraction. An increase in the current also produces an increase in the carrier density that leads to a decrease in the index of refraction. These two mechanisms thus have opposite effects on the index of refraction. Thermal effects dominate at low modulation frequencies, typically up to about 100 kHz, whereas carrier density effects dominate at higher modulation frequencies. On the one hand, thermal effects determine predominantly the slow wavelength tuning achievable in a typical semiconductor laser. On the other hand, when the current is modulated at a high modulation frequency (for example 1 GHz), the laser temperature remains stable at a value determined by the average current applied to the laser. High-frequency modulation of the optical frequency thus depends solely on carrier density effects. At intermediate modulation frequencies, both mechanisms contribute to the Frequency Modulation (FM) response of the laser. The thermal FM response dominates at DC and low modulation frequencies but decreases markedly at high modulation frequencies. The phase of the thermal FM response also shifts by 90 degrees when going from DC to high modulation frequencies. The thermal FM response is often approximated by a first order filter response similar to that of a RC circuit in electronics. On the other hand, the carrier FM response remains flat from DC to multi-GHz modulation frequencies until a resonance associated with the laser dynamics is reached.

Figure 1A:
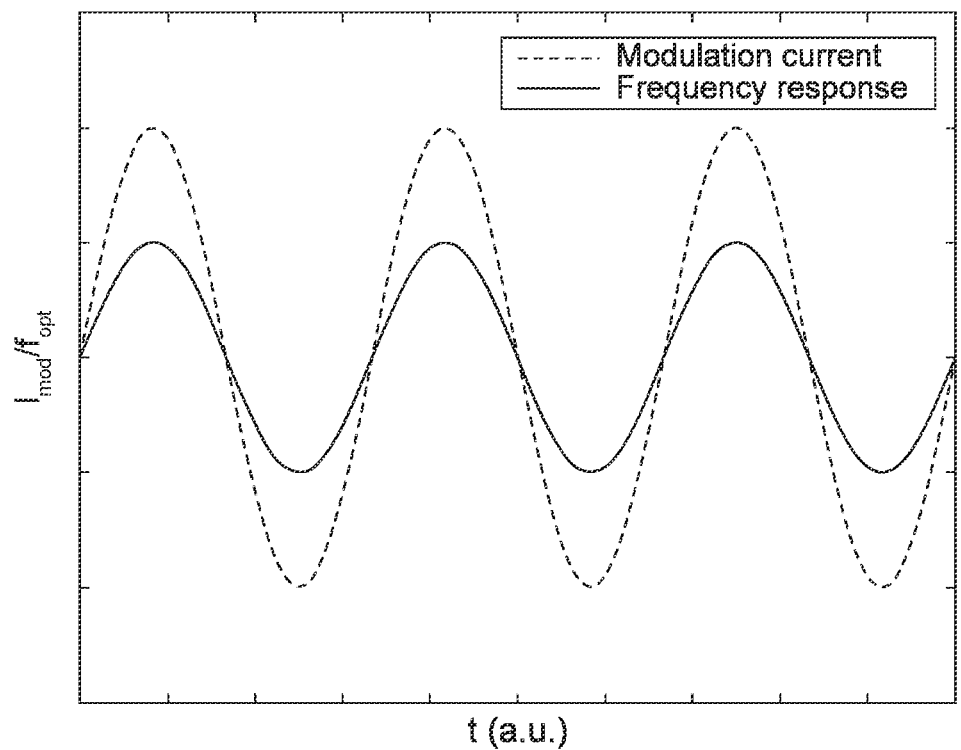
FIGS. 1A and 1B contrast an elementary purely sinusoidal current modulation with the resulting sinusoidal modulation of the optical frequency at the same modulation frequency for an FM response phase of 0 degree (FIG. 1A) and 180 degrees (FIG. 1B).
Figure 1B:
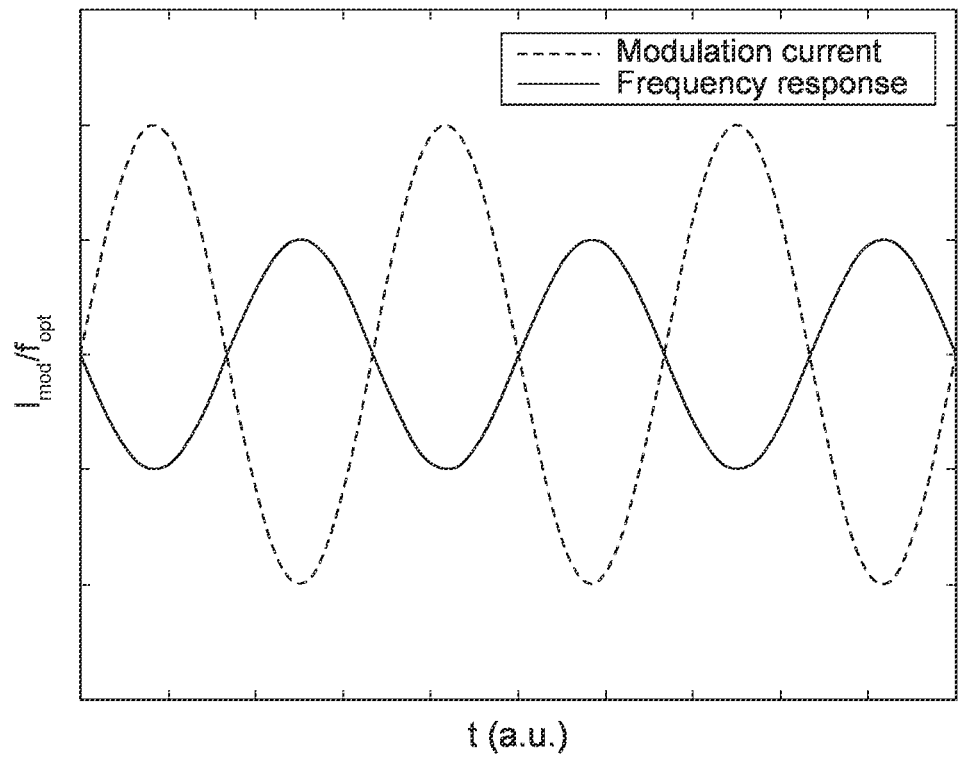

The graph of FIG. 1 (from L. A. Coldren, S. W. Corzine and M. I. Masanovic, Diode Lasers and Photonic Integrated Circuits 2nd ed., John Wiley & Sons (2012)) illustrates the typical frequency behaviour of the amplitudes of the thermal and carrier FM responses. The combination of these two contributions lead to an overall FM response that presents a sizable phase shift and significant amplitude variations when going from low to high frequencies. The phase of the FM response at a given modulation frequency ω characterizes the temporal alignment between an elementary purely sinusoidal current modulation at this modulation frequency and the resulting sinusoidal modulation of the optical frequency at this modulation frequency. For example, with reference to FIGS. 1A and 1B, if the phase of the FM response is 0 degree (FIG. 1A), then the sinusoidal modulation of the optical frequency reaches a maximum at the same time as the sinusoidal current modulation. Conversely, if the phase of the FM response at a given modulation frequency is 180 degrees (FIG. 1B), then the sinusoidal modulation of the optical frequency reaches a minimum when the current sinusoidal modulation reaches a maximum. By phase shift in the FM response, it is understood that the phase of the FM response depends on the modulation frequency. For example, the phase of the FM response at a first modulation frequency may be different from the phase of the FM response at a second modulation frequency. The phase shift of the FM response between two modulation frequencies represents the difference in the phases of the FM response at said two modulation frequencies. For applications relying on a well-defined modulation of the laser optical frequency, a FM response that presents a sizable phase shift and significant amplitude variations when going from low to high frequencies is far from ideal. A periodic current modulation applied to a laser comprises typically many elementary sinusoidal modulations of different modulation frequencies (harmonics). As known in the art, the amplitudes and phases of these harmonics can be obtained from the shape of the modulation signal by a Fourier decomposition. In order for the optical frequency modulation to faithfully reproduce the shape of the current modulation signal, the FM response of the laser preferably preserves the relative amplitudes and phases of the signal harmonics. An FM response that is flat in amplitude and phase over frequencies making up the current modulation spectrum is thus preferable in order for the laser optical frequency modulation to reproduce in time the shape of the current modulation applied to the laser.

The configurations and methods described herein advantageously improve the FM response flatness by providing a decrease in the thermal FM response.

Embodiments of Semiconductor Lasers

Figure 2A:
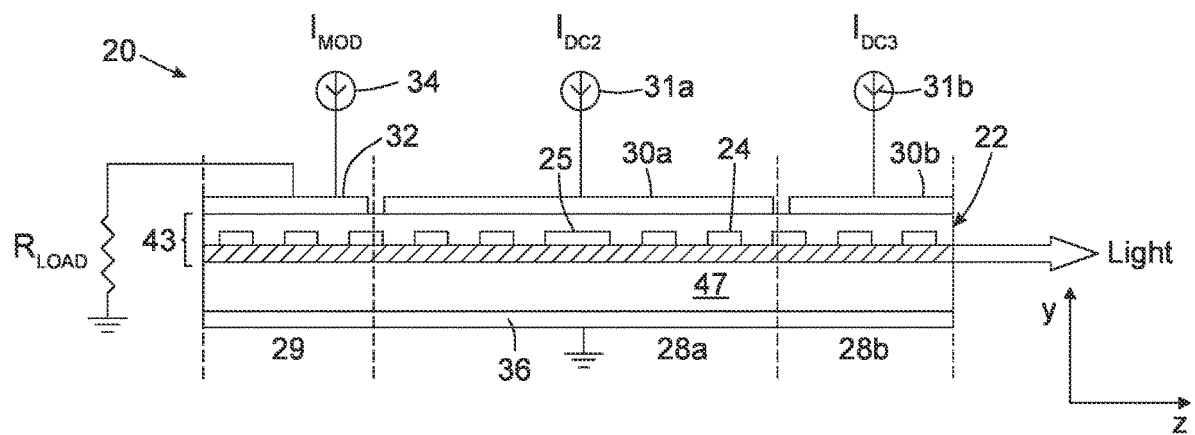
FIGS. 2A and 2B are cross-sectional side views of a semiconductor laser according to one embodiment, taken respectively parallel and perpendicular to the light propagation direction.
Figure 2B:
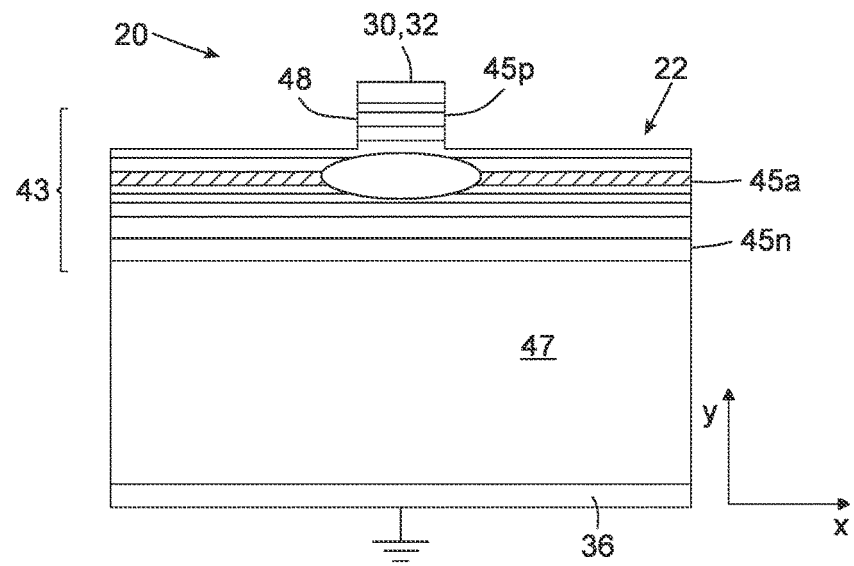

Referring to FIGS. 2A and 2B, there is shown a semiconductor laser 20 according to one embodiment. The semiconductor laser 20 includes a laser cavity 22. In some implementations, as shown in FIG. 2B, the laser cavity 22 of the semiconductor laser 20 includes, in a first direction y, a stack 43 of semiconducting layers 45 deposited on a semiconducting substrate 47. The chemical composition of the semiconducting layers 45 can vary from layer to layer and may for example comprise indium, gallium, arsenic, phosphorus, aluminum or the like. Some of the semiconducting layers 45 may be strained. The semiconducting layers 45p in one portion of the stack 43 are p-doped with an impurity material, such that they contain a sizable density of holes that contribute to their electrical conductivity. Likewise, layers 45n in another portion of the stack 43 are n-doped with a different impurity material such that they contain a sizable density of free electrons that contribute to their electrical conductivity. The substrate 47 may be doped as well. Between the p-doped and n-doped portions 45p, 45n of the stack 43 are found one or more active layers 45a meant to provide gain for the amplification of light propagating therein. The active layer or layers 45a may be doped or undoped depending on the implementation. The light amplification process results from the stimulated emission of photons when holes and free electrons recombine in the active layers 45a. For wording convenience, the stack 43 of layers 45 and the substrate 47 will be characterized electrically as a p-n junction in what follows. Under typical conditions of operation, this p-n junction is forward-biased by a current source injecting current from the p-side. Holes from the p-side and free electrons from the n-side then propagate to the active layers, where they recombine to produce light.

In some implementations, the stack 43 of semiconducting layers 45 is also designed to favor the confinement of carriers and photons within the active layers 45a, in order to maximize the recombination of holes and free electrons and the production of light therein. The index of refraction profile of the stack 43 of layers 45 along the first direction y may provide guidance for an optical mode with a maximum optical intensity close to the active layers 45a. A double heterostructure with a bulk active layer or a quantum heterostructure comprising quantum wells or dots and confinement layers are examples of structures providing the desired carrier and photon confinement.

Still referring to FIG. 2B, the cavity 22 of the semiconductor laser 20 further includes a confinement structure 48 in a second direction x perpendicular to the first direction y, favoring the confinement of light and of the current along the second direction x. A ridge waveguide as illustrated in FIG. 2B is an example of such a confinement structure. Another example is a buried heterostructure, more complex than a ridge waveguide but more effective in ensuring spatial colocalization of the optical power and pumping current.

The combination of the stack 43 of semiconducting layers 45 in the first direction y and of the confinement structure 48 in the second direction x supports a transversal optical mode that can propagate along a light propagation direction z perpendicular to the first direction y and the second direction x, the light propagation direction z corresponding to the longitudinal direction along cavity 22. The transversal optical mode further gets amplified due to its interaction with the active layers 45a of the stack 43 as it propagates along the light propagation direction z.

The laser cavity 22 of the semiconductor laser 20 further includes a reflective structure 24 providing optical feedback for the laser light, i.e. reflecting the laser beam along the light propagation direction z. For example, in a distributed feedback (DFB) configuration, a single reflector 24 such as a Bragg grating as shown in FIG. 2A is distributed along the length of the laser. The Bragg grating comprises a periodic corrugation that partially reflects laser light at all positions along said Bragg grating. In other implementations (not shown), opposite end-of-cavity reflectors may be provided, for example as in a Distributed Bragg Reflector (DBR) configuration, where a localized Bragg grating reflector is located at one end of the laser or at each end of the laser. The end facets of the laser, either coated or uncoated, can also provide feedback to sustain the laser oscillation.

In order to achieve single mode oscillation of the laser, the laser cavity 22 of the semiconductor laser 20 may also include means to provide adequate spectral filtering, to impede oscillation of all longitudinal modes except one. This spectral filtering may be provided by the reflective structure providing optical feedback for the laser light. A DFB laser comprising a uniform Bragg grating is likely to oscillate simultaneously on two modes. This occurrence can be avoided if one end facet of the laser also provides feedback for the laser light. In this case, the outcome depends on the phase of the grating corrugation at the reflective facet. In practice, cleaving the laser cannot usually be achieved with sufficient accuracy to control the phase of the grating at the reflective end facet. Lasers thus configured must be sorted according to whether they oscillate on two longitudinal modes or on a single longitudinal mode. In the embodiment illustrated in FIG. 2A, single mode oscillation is ensured by introducing a $\pi$ phase shift 25 at one point of the Bragg grating of a DFB laser, typically in the middle of the laser length. In this case, the end facets are coated with anti-reflection coatings to ensure that only the Bragg grating provides feedback for the laser light. It is also possible to use a Bragg grating in which the corrugation period is different over a short grating segment, located typically in the middle of the laser length, from the period along the rest of the grating. The gratings in a DBR configuration can also be configured to ensure single mode oscillation of a laser. Other means to ensure singe mode operation of the semiconductor laser may be used as will be readily understood by one skilled in the art.

The semiconductor laser 20 includes a plurality of electrodes 30, 32 disposed along the light propagation direction z of the laser cavity 22. Each electrode 30, 32 is coupled to a section of the cavity 22 of the semiconductor laser 20, which therefore defines a corresponding cavity section 28, 29. The mode of operation of a cavity section coupled to an electrode may be determined by electrical components connected to this electrode and their mode of operation. In accordance with one aspect, the semiconductor laser 20 includes one or more amplification sections 28 and one or more modulation sections 29. Each amplification section 28 is operated in a forward-biased mode, that is, with current flowing through the amplification section 28 from the p-side to the n-side of the p-n junction. Each amplification section 28 contributes to photon generation within the semiconductor laser 20. Each modulation section 29 is operated preferably in photovoltaic mode. One skilled in the art will readily understand that operation in photovoltaic mode involves a current leaving the modulation section 29 through the electrode connected to the p-side of the p-n junction in the modulation section 29. Typically, a moderate positive voltage is applied between the p-side and n-side of the p-n junction. The modulation section (or sections) 29 does not contribute photons within the semiconductor laser. It however receives a modulation signal for modulating the optical frequency of the laser output beam.

In one implementation, for example shown in FIG. 2A, the electrode 30 of each amplification section 28 receives a DC current IDC, typically provided by a DC current source connected to this electrode 30. The DC current flows through the corresponding amplification section 28 from the p-side to the n-side of the p-n junction. Furthermore, the current is preferably large enough to inject a sufficient number of holes and free electrons in the active layers 45*a* to provide gain to the laser light. Each amplification section 28 thus contributes to the generation of light within the semiconductor laser 20. While FIG. 2A shows a configuration having two amplification sections 28, the number of such sections and associated electrodes may differ in other variants. In some implementations, the applied DC current may vary from one amplification section to another. In other variations, a DC voltage source may be used to forward bias the amplification section 28.

As mentioned above, the plurality of cavity sections defined by the plurality of electrodes also includes at least one modulation section 29. In some implementations, each modulation section 29 remains below transparency, i.e. it does not provide gain for light amplification but is rather optically absorbent. Each modulation section 29 is operated at a much lower density of holes and free electrons than the amplification sections 28. It is coupled to an electrode 32 receiving a modulation signal. The modulation signal is applied across the modulation section 29 to provide the desired modulation of the output optical frequency of the semiconductor laser 20. The modulation signal may differ from one modulation section 29 to another.

In the embodiment illustrated in FIG. 2A, the semiconductor laser 20 includes three electrodes 30*a*, 30*b* and 32 on the p-side of the p-n junction and one ground electrode 36 on the n-side of the p-n junction. The amplification sections 28*a* and 28*b* coupled with electrodes 30*a* and 30*b* are forward-biased above transparency by DC current IDC2 and IDC3 from current sources 31*a* and 31 *b* respectively, and therefore contribute to the laser emission. A modulation signal source 34 is coupled to the modulation section 29 via electrode 32 to produce a modulation of the laser output optical frequency. The modulation signal source 34 in the present embodiment is an AC current source providing a modulated current Imod. In another embodiment, the modulation signal source 34 can be an AC-coupled voltage source providing a modulated voltage.

The modulation section 29 of the cavity 22, which receives the modulation signal provided by modulation signal source 34, is below transparency, i.e. it is optically absorbing rather than amplifying. The carrier density within the modulation section 29 remains low enough that optical amplification through stimulated emission does not occur. To the contrary, photons propagating within a section below transparency are lost by absorption, photons creating free carriers (electron-hole pairs) rather than the opposite. As a result, the modulation section does not contribute photons to the laser emission. However, the low carrier density in the modulation section 29 favors a large gain lever effect leading to a large carrier FM response. The gain lever effect occurs when a modulated current is applied to a section where the density of holes and electrons (carriers) is weaker than in other sections. For some semiconductor lasers, for example lasers having quantum wells as active layers, the gain saturates as a function of the carrier density. In other words, the gain increases more slowly as a function of the carrier density when the carrier density is large. Likewise, the absorption in a section under transparency varies more rapidly as a function of the carrier density when the carrier density is small. As the modulated current goes up in a modulation section with a weak carrier density, the local carrier density goes up and the absorption goes down. In reaction to this absorption decrease, the optical power goes up and the gain in the rest of the cavity goes down. The gain decrease in the rest of the cavity compensates for the absorption decrease in the modulation section so that the overall gain for a round trip inside the laser cavity remains equal to unity. Because of the aforementioned saturation, the required gain decrease in the rest of the cavity to bring the laser back to equilibrium comes along with a larger carrier density decrease and thus a larger index of refraction increase. Applying the modulated current to a modulation section where the carrier density is low in comparison to the carrier density in amplification sections produces a stronger carrier FM response, which is flat, thus improving the flatness of the overall FM response. A given optical frequency modulation can thus be achieved with a weaker modulation signal and thus with reduced temperature fluctuations.

The free carriers generated within the modulation section by photon absorption can further absorb photons (free carrier absorption). They eventually release their energy as heat within the section, either through the Joule effect or by non-radiative recombination. In order to minimize temperature fluctuations within the modulation section and the associated thermal FM response, the semiconductor laser 20 further includes a photovoltaic mode element, typically embodied by one of more electrical components connected to the electrode coupled to each modulation section to ensure that the modulation section operates in photovoltaic mode, similarly to a solar cell. In this mode of operation, the modulation section 29 has a moderate positive voltage difference between the p-side and the n-side of its p-n junction. This voltage difference is low enough that the modulation section remains optically absorbent as aforementioned. Furthermore, current flows opposite to the voltage difference, i.e. it comes out from the p-side of the modulation section. This behaviour is made possible by the absorption of photons coming from the rest of the laser. The condition of a current flow opposite the voltage (hence VI<0) ensures that electrical power is extracted from the modulation section rather than the opposite. This electrical extraction of power reduces the power being dissipated as heat in the modulation section.

Figure 3:
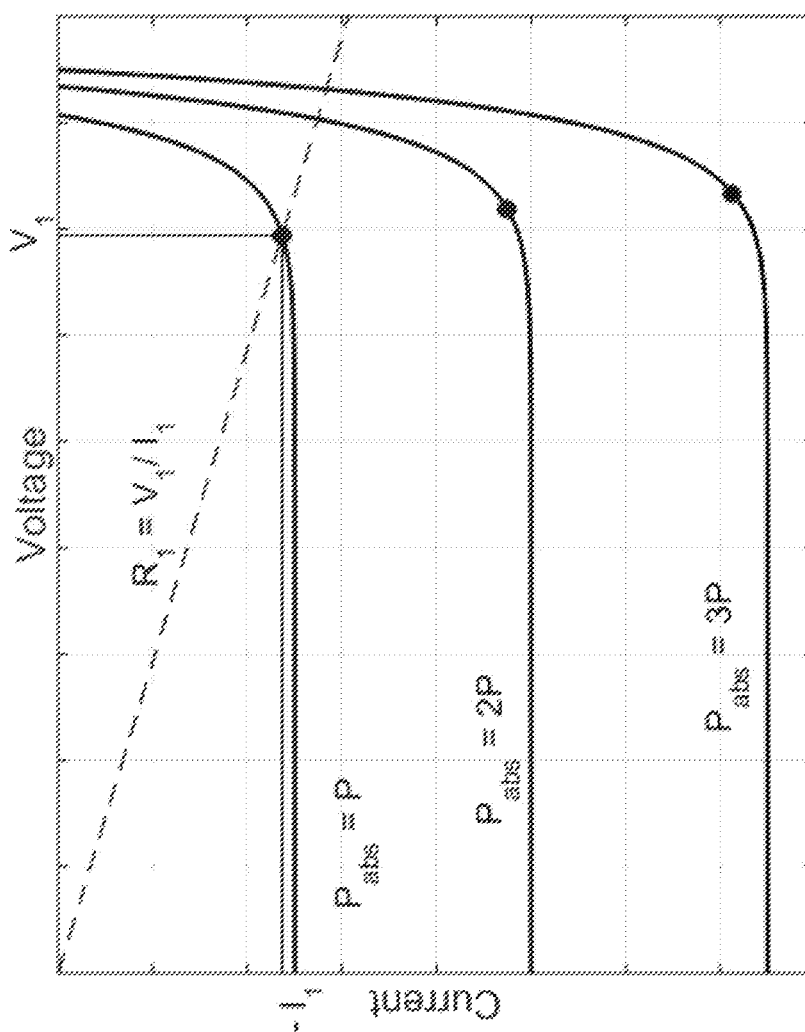
FIG. 3 is a graph illustrating the I-V curves of a modulation section operating in photovoltaic mode for three values of the absorbed optical power.
Figure 4A:
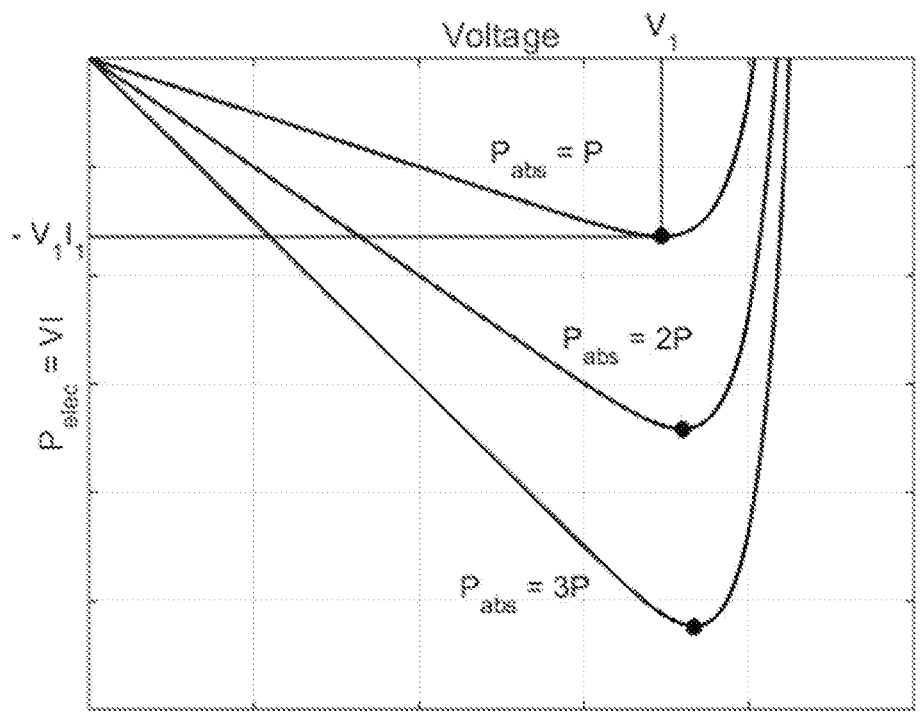
FIGS. 4A and 4B present the electrical power extracted from the modulation section as a function of voltage and as a function of current, respectively.
Figure 4B:
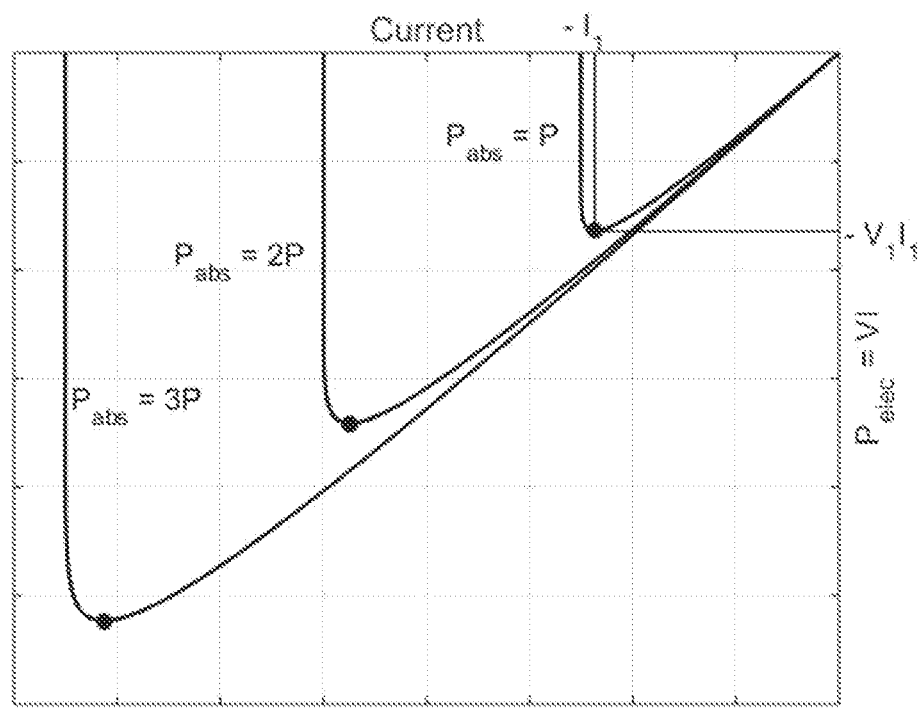

FIG. 3 illustrates the I-V curves of a modulation section operating in photovoltaic mode for three values of the optical power Pabs that gets absorbed by the modulation section. The voltage and current are both equal to 0 at the top left corner of the graph. The voltage difference between the p-side and n-side of the modulation section is positive (Vp>Vn). The current is negative, indicating that it comes out from the p-side of the modulation section. The current obtained when the p-side and n-side of the modulation section are short-circuited (V=0) can be read on the vertical axis. As shown, it is proportional to the absorbed optical power. The voltage between the p-side and n-side of the modulation section when they are open-circuited (I=0) can be read on the horizontal axis. This voltage presents a logarithmic dependence on the absorbed optical power. The electrical power (=VI) vanishes when either the voltage (short circuit condition) or the current (open circuit condition) is equal to zero. In-between, the electrical power is negative and thus extracted from the modulation section. FIGS. 4A and 4B present the electrical power as a function of voltage and as a function of current, respectively. The dots identify the conditions under which the electrical power extracted from the modulation section is maximum. For example, when the absorbed optical power Pabs is equal to P, the extracted electrical power is maximum at voltage V1 and current—I1. In some implementations, it is preferable to operate the modulation section at or close to these conditions. This minimizes fluctuations of the electrical power extracted from the modulation section when a voltage or current modulation signal is applied to the laser section. This in turn reduces temperature fluctuations caused by the modulation signal.

Referring back to FIG. 2A, the illustrated embodiment includes a resistor RLOAD connected in parallel to the modulation section 29. This resistor imposes that the voltage between the p-side and n-side of the modulation section 29 equals V=RLOADI, where I is the amplitude (absolute value) of the current leaving the modulation section 29 from the p-side of the p-n junction. This relationship between voltage and current is represented graphically by the dashed load line in FIG. 3 in the case of a resistor of value R1. The actual point of operation is given by the intersection of the resistor load line and the I-V curve of the modulation section. Preferably, the resistor is chosen such that this point of intersection corresponds or is close to an optimal point of operation from an electrical power extraction standpoint. In the case illustrated in FIG. 3 and FIG. 4, for a given absorbed optical power P, a resistor with value R1 provides an optimum point of operation. A suitable load resistor is thus a first example of electrical components used to ensure photovoltaic operation of the modulation section.

Figure 5:
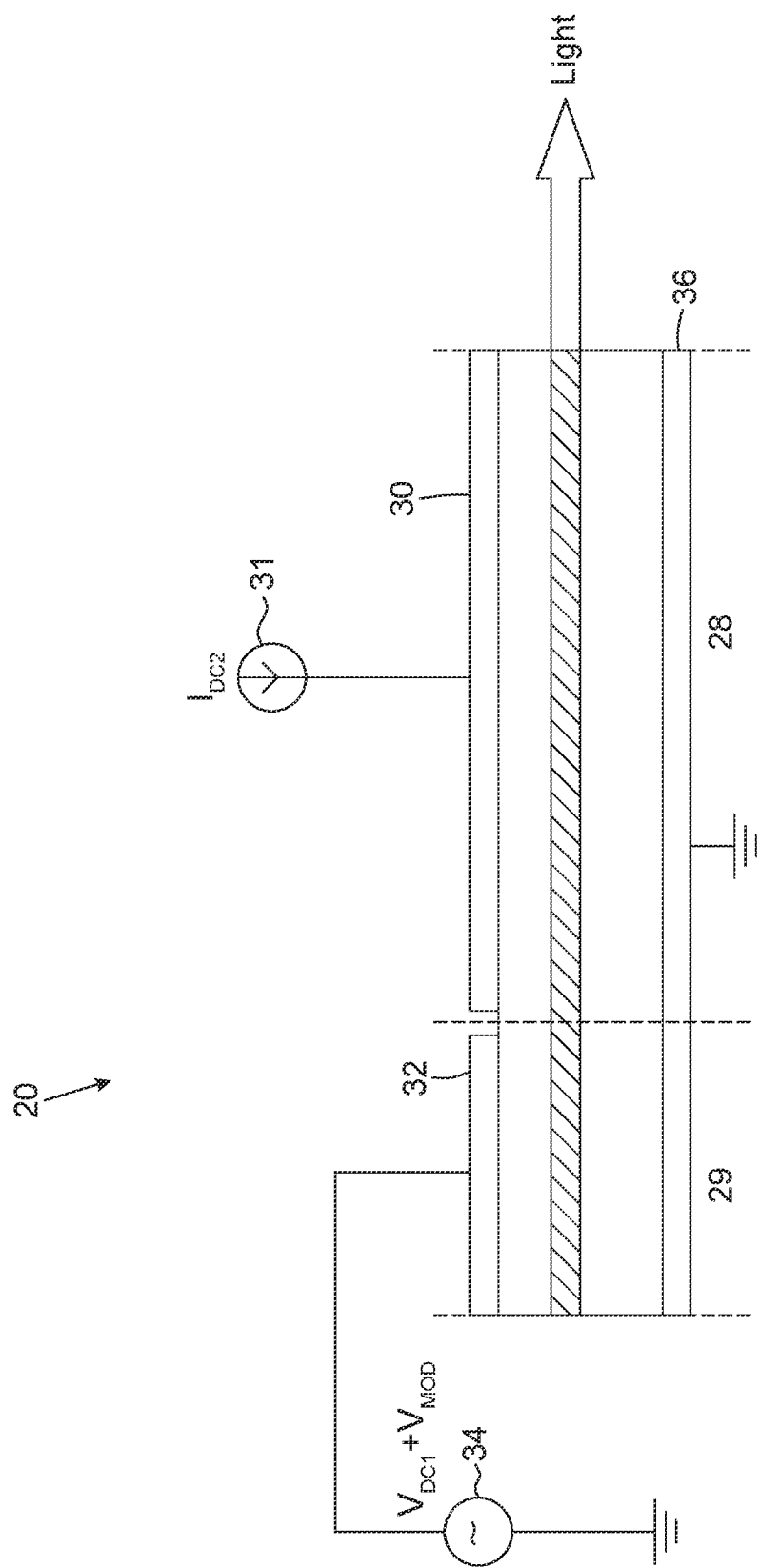
FIG. 5 is a perspective cross-sectional side view of a semiconductor laser according to one embodiment.

Referring to FIG. 5 there is shown a semiconductor laser 20 according to another embodiment. In this illustrated variant, the laser has two electrodes 30 and 32 on top of the p-side of the laser junction, and one ground electrode 36 on the n-side of the p-n junction. The amplification section 28 is coupled to electrode 30 and is biased above transparency by DC current source 31 providing a current IDC2 to enable laser emission. A modulation signal source 34 connected to electrode 32 provides a modulation voltage Vmod to the modulation section 29 in order to produce a modulation of the laser output optical frequency. In this embodiment, a DC voltage VDC1 biases the modulation section 32 below transparency at a positive voltage preferably corresponding or being close to an optimal point of operation. For example, in the case illustrated in FIG. 3, the voltage VDC1 should be equal or close to V1 when the optical power absorbed by the modulation section is equal to P. In practice, the modulation signal source 34 may include a DC voltage source and an AC-coupled modulated voltage source combined with a bias tee as appreciated by a person skilled in the art.

Figure 6:
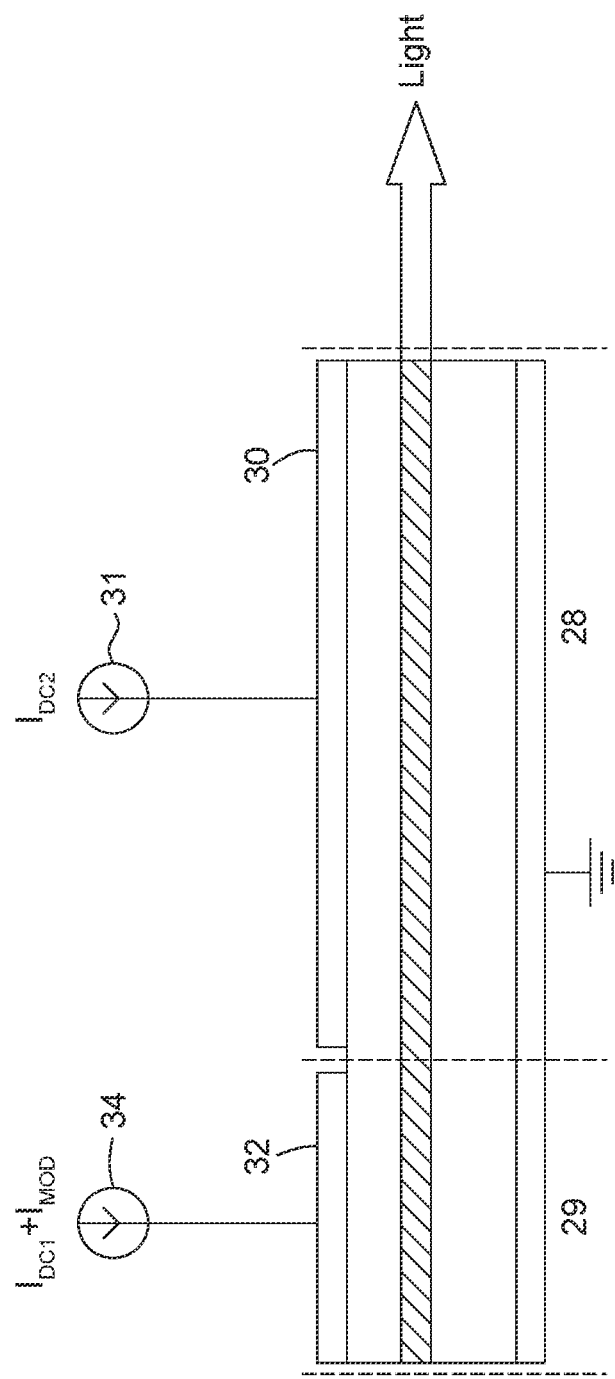
FIG. 6 is a perspective cross-sectional side view of a semiconductor laser according to one embodiment.

Referring to FIG. 6, in another embodiment, the modulation signal source 34 is embodied by a current source connected to the p-side of the modulation section 29 that provides a DC current IDC and a modulated current Imod. The DC current IDC should correspond to an optimal point of operation, e.g. a current of amplitude (absolute value) equal or close to I1 coming out from the top (p-side) of the modulation section in the case illustrated in FIG. 3 when the optical power absorbed by the modulation section equals P.

Figure 7:
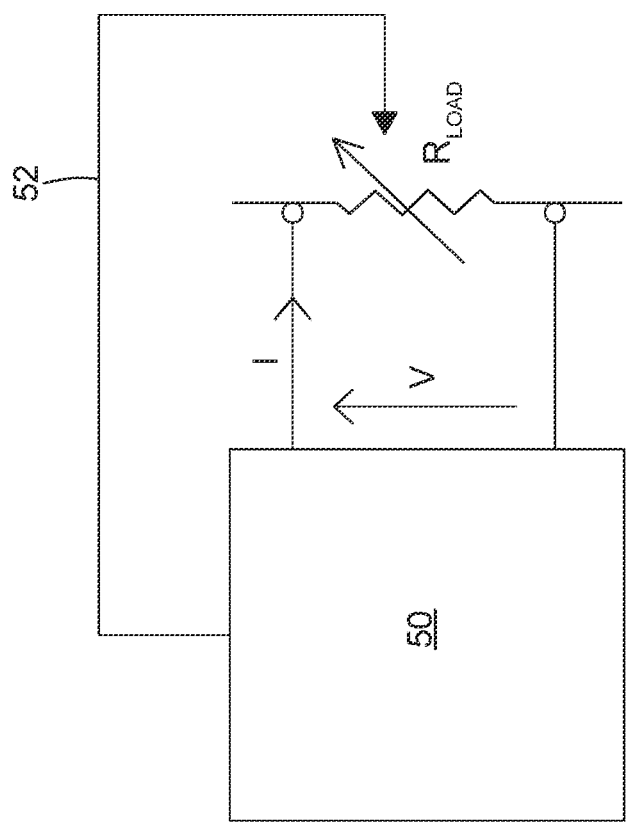
FIG. 7 schematically illustrates the use of an electronic circuit to measure the voltage and current across an adjustable resistor and produce a signal to adjust the resistance of the adjustable resistor.

As shown in FIGS. 3, 4A and 4B, the optimum point of operation for the modulation section depends on the optical power absorbed by said section. The optimum voltage does not vary much with the absorbed optical power. On the other hand, the optimum current is nearly proportional to the absorbed optical power. As a result, the optimum load resistor is nearly inversely proportional to the absorbed optical power. In a preferred embodiment, the electrical components chosen to select the point of operation in the modulation section, either a load resistor, a current source or a voltage source, is adjustable to accommodate different conditions of operation of the laser, either imposed by a user or resulting from laser aging. In such an implementation, the semiconductor laser may further include a feedback loop driving the control of the point of operation in the modulation section. For example, in the illustrated configuration of FIG. 2A the power extracted from the modulation section 29 is dissipated in the load resistor RLOAD connected in parallel to said modulation section. The power dissipated in the load resistor thus provides a measure of the power being extracted from the modulation section 29. The feedback loop can be set up to maximize the power dissipated in the adjustable load resistor and thus lock the modulation section to an optimum point of operation. A possible implementation is illustrated in FIG. 7 where an electronic circuit 50 measures the voltage V and current I across an adjustable resistor RLOAD and produces a signal 52 to adjust the resistance of the adjustable resistor RLOAD to optimize the power dissipated within said adjustable resistor.

Modelling and Results

Figure 8A:
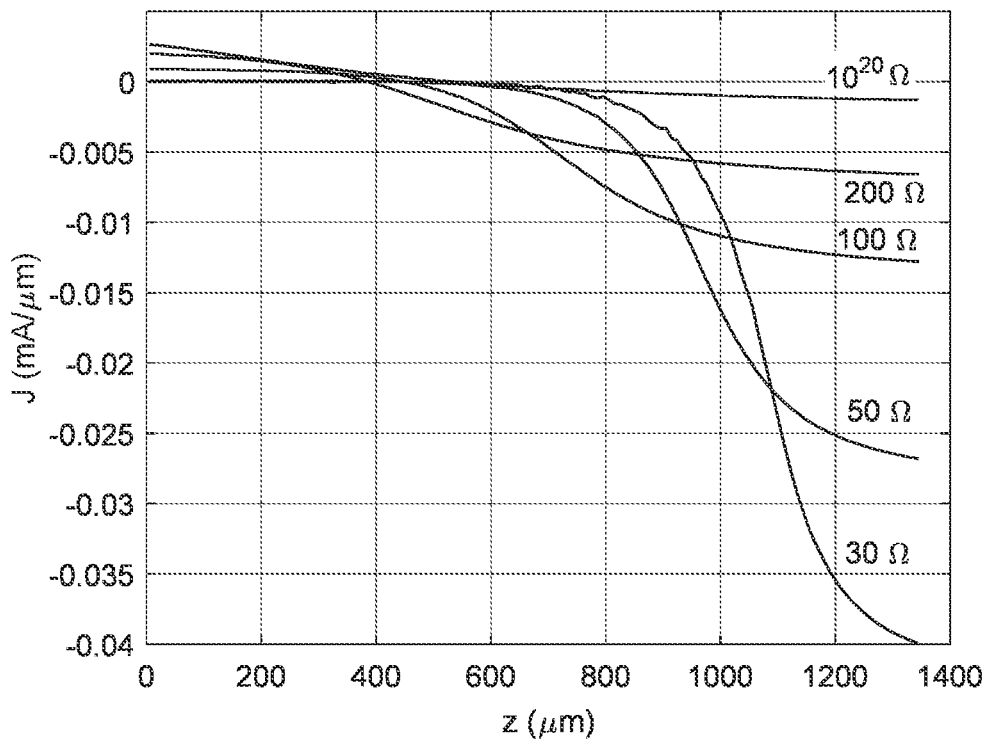
FIG. 8A presents the simulated optical power evolution along the modulation section of a semiconductor laser according to one embodiment for five values of load resistance.
Figure 8B:
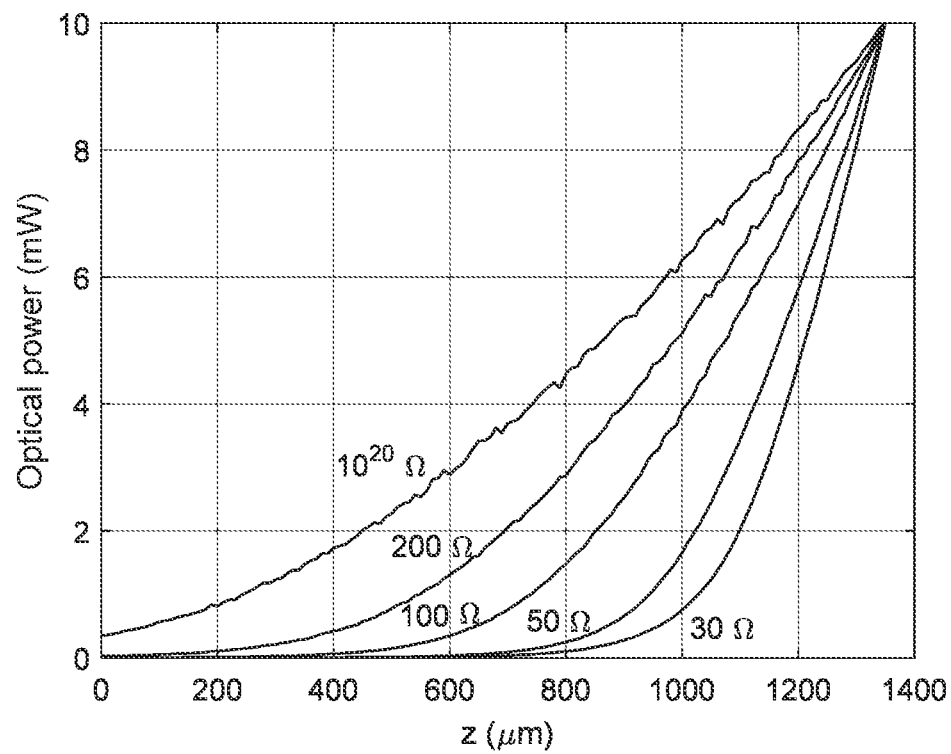
FIG. 8B presents the current density per unit length transiting through the top electrode of the modulation section.
Figure 8C:
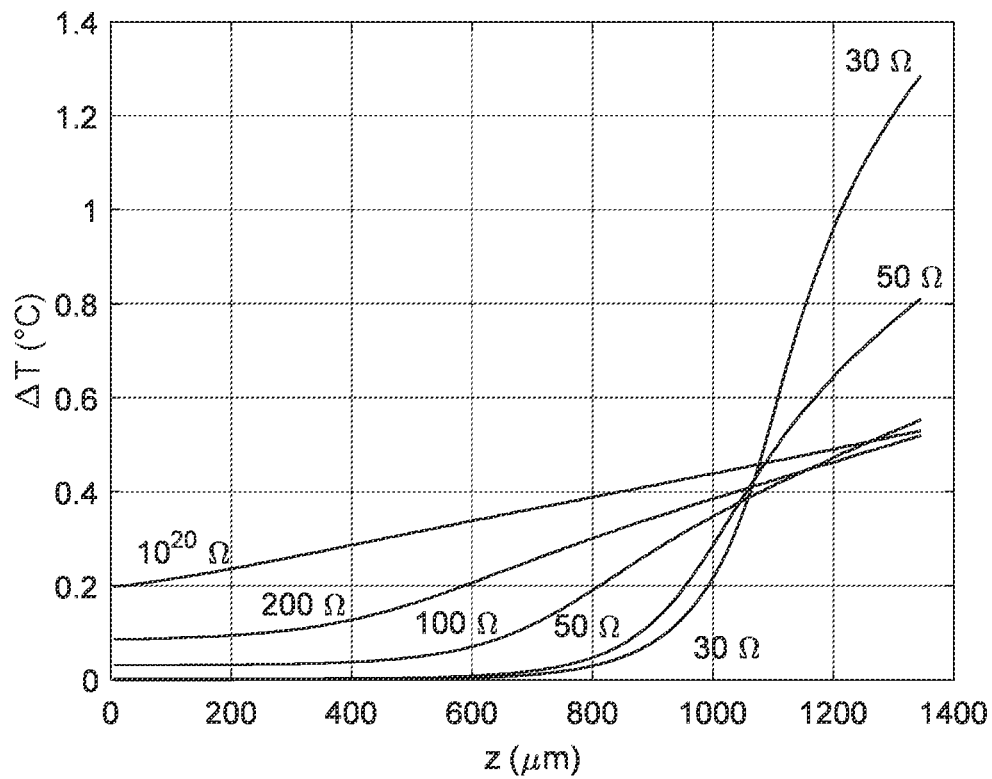
FIG. 8C shows the temperature elevation in the section relatively to the temperature of the heat sink on which stands the section.
Figure 8D:
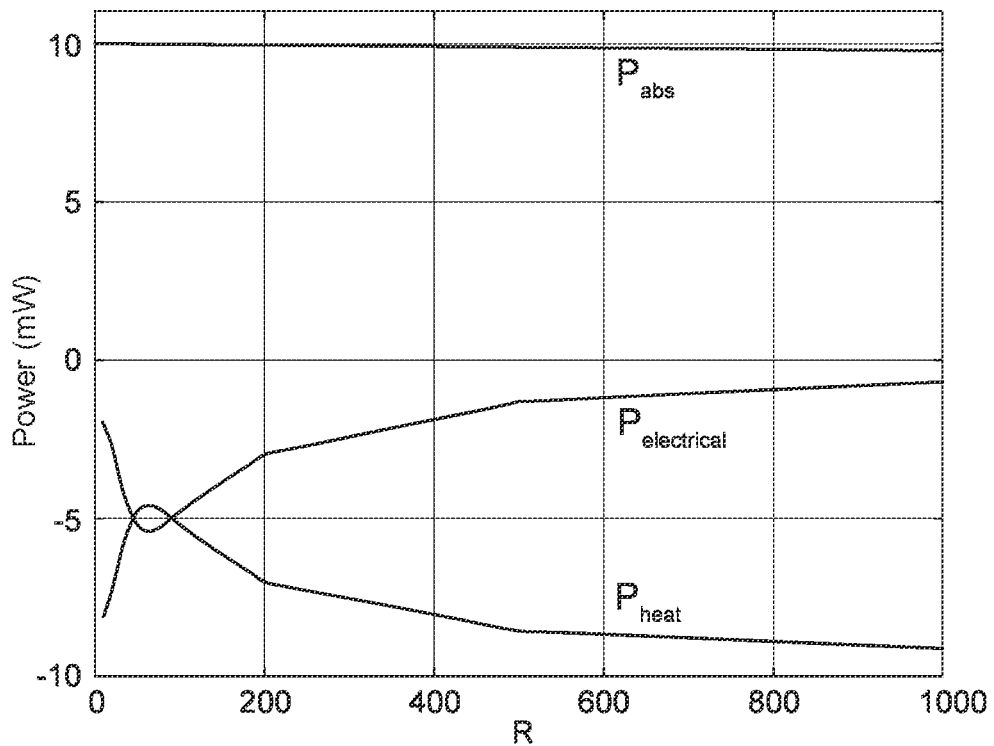
FIG. 8D presents the influence of the load resistance on the absorbed optical power, the dissipated heat and the electrical power transiting through the top electrode, all integrated over the whole section length.

The curves in FIGS. 3, 4A and 4B were obtained using a simple model customarily used to describe the behaviour of a photodiode. The power extraction was also investigated numerically with a more involved semiconductor laser modelling software. To this end, an InGaAsP gain section with six quantum wells and facets with perfect anti-reflection coatings was considered, and used as a photodiode, and therefore left unbiased. The section was 1350 µm in length and left unbiased. Furthermore, a load resistor was connected in parallel with the section. The software was used to model the effect of the load resistance on the heat dissipation and the temperature in the section receiving 10 mW of injected monochromatic light at 1557 nm. FIGS. 8A through 8D illustrate results obtained with the modelling. FIG. 8A presents the optical power evolution along the section for five values of the load resistance (1020 Ω, 200 Ω, 100 Ω, 50 Ω, 30Ω). The incoming light is incident from the right, i.e. it enters the section at z=1350 µm. The attenuation of light as it propagates in the section gets more severe in the presence of a lower load resistance because free carriers exiting the section can no longer give back photons to the propagating light through the process of stimulated emission. FIG. 8B presents the current density per unit length transiting through the top electrode. Negative values are indicative of current leaving the section, while positive values are indicative of current entering the section. A reduction in the load resistance favors an increase in the number of free carriers leaving the section especially near the entrance point of the light. FIG. 8C shows the temperature elevation in the section relatively to the temperature of the heat sink on which stands the section. Reducing the load resistance leads to a decrease in the temperature elevation over most of the section length. However, for the two lowest resistances (30 Ω, 50Ω), the temperature elevation rises near the entrance point of light. Finally, FIG. 8D presents the influence of the load resistance on the absorbed optical power Pabs, the dissipated heat Pheat and the electrical power transiting through the top electrode Pelectrical, all integrated over the whole section length. The incident optical power is nearly completely absorbed by the section for all load resistances. In the absence of a load resistor, the absorbed optical power gets dissipated as heat in the section (heat is represented by negative numbers in the graph since it eventually leaves the section through the heat sink). However, the load resistor leads to a decrease in the heat dissipation within the section. From this point of view, a load resistance of 60Ω appears optimal as it halves the heat dissipation within the section. The electrical power transiting through the top electrode is negative, indicating that it leaves the section. The absorbed optical power that is not dissipated as heat in the section is dissipated in the load resistor. The more sophisticated modelling thus confirms the main conclusions drawn with the simpler photodiode model, especially the existence of a load resistance maximizing the extraction of power from the section, thus minimizing the variations of heat generation as the section is modulated.

The improvement in the FM response of a semiconductor laser afforded by embodiments described herein was demonstrated experimentally with a laser under development for FMCW lidar applications. As known in the art, in a FMCW lidar application, applying a periodic triangular current modulation IMOD to the laser should produce as closely as possible a similar periodic triangular modulation of the optical frequency as illustrated in FIGS. 9A and 9B. To this end, the FM response of the laser should be flat in amplitude and phase over frequencies making up the current modulation spectrum. Typically, FMCW lidars operate at a modulation frequency at which both temperature and carrier density variations contribute to the overall laser FM response. In the case at hand, the modulation frequency was 100 kHz. At this modulation rate, the thermal FM response can introduce significant distortion in the optical frequency modulation and should be minimized.

Figure 10A:
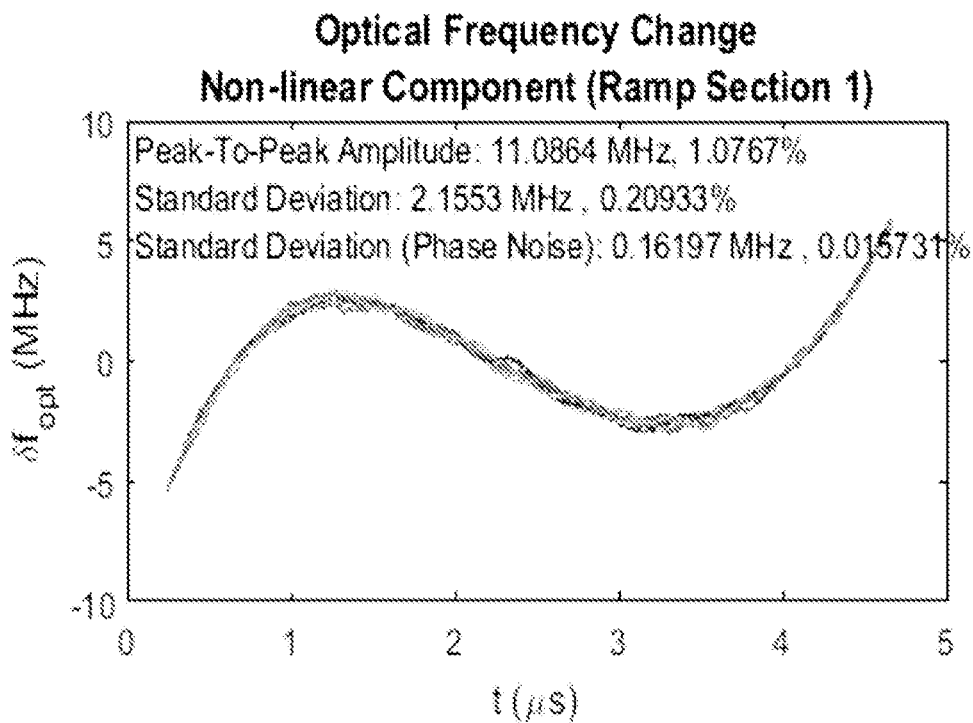
FIGS. 10A and 10B illustrate the experimentally obtained optical frequency change using a semiconductor laser having a configuration such as shown in FIG. 2A.
Figure 10B:
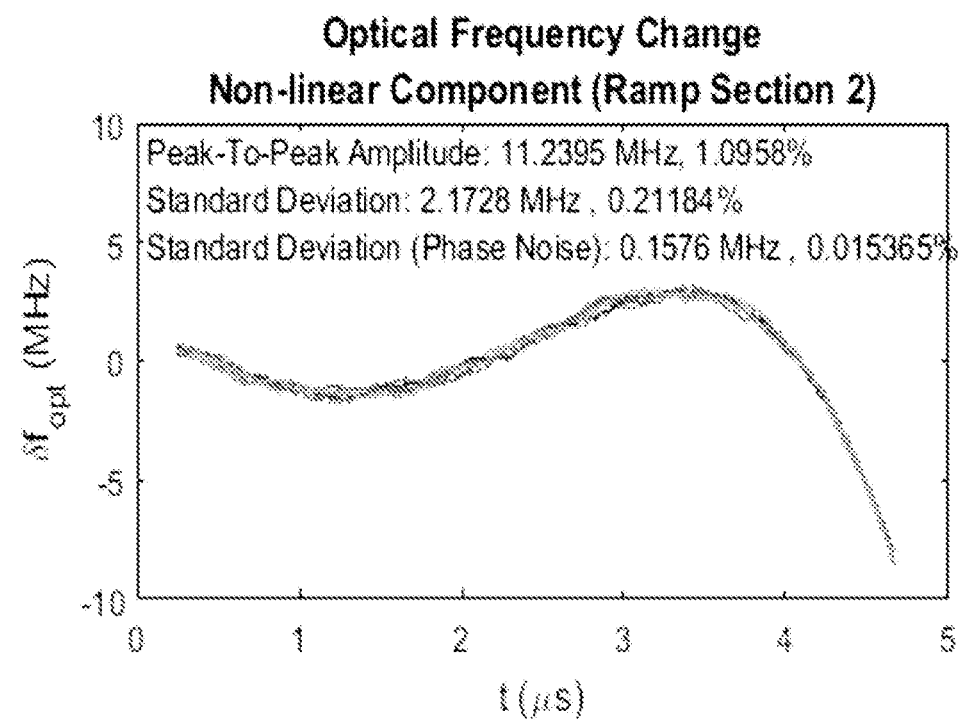

Referring to FIGS. 10A and 10B experiments were performed with InGaAsP DFB semiconductor lasers having three electrodes, similar to the configuration illustrated in FIG. 2A. The modulation section at the back of the laser was unbiased and thus well below transparency. A load resistor of 50Ω was connected in parallel with the modulation section. A triangular current modulation was applied to the modulation section with an amplitude providing a peak-to-peak optical frequency modulation of 1 GHz. A linear fit was performed over 90% of the up-ramp and down-ramp of the triangular frequency modulation and subtracted to determine the deviation from the ideal linear frequency modulation. The peak-to-peak nonlinear distortion amounted to 12 MHz, i.e. slightly over 1% of the actual frequency excursion. The symmetry in the nonlinear distortion observed on the up-ramp and the down-ramp is an indication that the thermal FM response contributed little to the distortion. It was also observed that different conditions of operation of the laser leading to a change in the optical power incident on the modulated back section could be accommodated by changing the load resistor.

Numerous modifications could be made to the embodiments above without departing from the scope of the invention.

The invention claimed is:

1. A frequency-modulated continuous wave semiconductor laser, comprising:
   a single mode laser cavity comprising a stack of semiconducting layers defining a transversal p-n junction and having a longitudinal light propagation direction;
   a plurality of electrodes each coupled to a corresponding section of the laser cavity along the longitudinal light propagation direction, each corresponding section defining one of an amplification section or a modulation section inside of the single mode laser cavity;
   one or more DC sources each coupled to the electrodes associated with said amplification sections and operable to forward-bias the p-n junction above transparency so as to provide gain in the associated amplification sections; and
   one or more modulation signal sources each coupled to the electrodes associated with said modulation sections and operable to apply a modulation signal across said p-n junction below transparency, the modulation signal providing a modulation of an output optical frequency of the semiconductor laser, the one or more modulation signal sources comprise at least one AC current source configured to inject a modulated current accross the p-n junction in the modulation sections, the modulated current differing from the one modulation section to another;
   wherein each modulation section is operated in photovoltaic mode.

2. The semiconductor laser according to claim 1, wherein the single mode laser cavity comprises a substrate supporting the stack of semiconductor layers, and the stack of semiconductor layers comprises, along a first direction transversal to the light propagation direction:
   a. one or more contiguous p-doped layers;
   b. one of more contiguous n-doped layers; and
   c. one of more contiguous active layers extending between the p-doped layers and the n-doped layers.

3. The semiconductor laser according to claim 2, wherein the stack of semiconducting layers has an index of refraction profile along the first direction configured to provide guiding for an optical mode with a maximum optical intensity close to the active layers.

4. The semiconductor laser according to claim 2, wherein the single mode laser cavity comprises a confinement structure in a second direction perpendicular to the first direction and to the light propagation direction, the confinement structure being configured to confine light and current along the second direction.

5. The semiconductor laser according to claim 1, wherein the single mode laser cavity further comprises a reflective structure configured to provide optical feedback along the light propagation direction.

6. The semiconductor laser according to claim 5, wherein the reflective structure is arranged in one of a distributed feedback configuration and a distributed Bragg reflector configuration.

7. The semiconductor laser according to claim 5, wherein the reflective structure comprises a distributed Bragg grating comprising a plurality of periodic corrugations along the light propagation direction.

8. The semiconductor laser according to claim 7, wherein the distributed Bragg grating comprises a $\pi$ phase shift.

9. The semiconductor laser according to claim 7, wherein the periodic corrugations have a period that varies along the light propagation direction.

10. The semiconductor laser according to claim 1, wherein the one or more DC sources comprises at least one DC current source configured to inject a DC current across the p-n junction in the amplification sections.

11. The semiconductor laser according to claim 1, comprising a single amplification section.

12. The semiconductor laser according to claim 1, comprising at least two amplification sections.

13. A frequency-modulated continuous wave semiconductor laser, comprising:
   a single mode laser cavity comprising a stack of semiconducting layers defining a transversal p-n junction and having a longitudinal light propagation direction;
   a plurality of electrodes each coupled to a corresponding section of the laser cavity along the longitudinal light propagation direction, each corresponding section defining one of an amplification section or a modulation section inside of the single mode laser cavity;
   one or more DC sources each coupled to the electrodes associated with said amplification sectionos and operable to forward-bias the p-n junction above transparency so as to provide gain in the associated amplification sections; and
   one or more modulation signal sources each coupled to the electrodes associated with said modulation sections and operable to apply a modulation signal across said p-n junction below transparency, the modulation signal providing a modulation of an output optical frequency of the semiconductor laser;
   wherein each modulation section is operated in photovoltaic mode, the semiconductor laser comprising, in association with each modulation section, a photovoltaic mode element connected to the corresponding electrode, the photovoltaic mode element comprises a load resistor.

14. The semiconductor laser according to claim 13, wherein the single mode laser cavity comprises a substrate supporting the stack of semiconductor layers, and the stack of semiconductor layers comprises, along a first direction transversal to the light propagation direction:
   a. one or more contiguous p-doped layers;
   b. one or more contiguous n-doped layers, and
   c. one or more contiguous active layers extending between the p-doped layers and the n-doped layers.

15. The semiconductor laser according to claim 14, wherein the stack of semiconducting layers has an index of refraction profile along the first direction configured to provide guiding for an optical mode with a maximum optical intensity close to the active layers.

16. The semiconductor laser according to claim 14, wherein the single mode laser cavity comprises a confinement structure in a second direction perpendicular to the first direction and to the light propagation direction, the confinement structure being configured to confine light and current along the second direction.

17. The semiconductor laser according to claim 13, wherein the single mode laser cavity further comprises a reflective structure configured to provide optical feedback along the light propagation direction.

18. The semiconductor laser according to claim 17, wherein the reflective structure is arranged in one of a distributed feedback configuration and a distributed Bragg reflector configuration.

19. The semiconductor laser according to claim 17, wherein the reflective structure comprises a distributed Bragg grating comprising a plurality of periodic corrugations along the light propagation direction.

20. The semiconductor laser according to claim 19, wherein the distributed Bragg grating comprises a $\pi$ shift.

21. The semiconductor laser according to claim 19, wherein the periodic corrugations have a period that varies along the light propagation direction.

22. The semiconductor laser according to claim 13, wherein the one or more DC sources comprises at least one DC current source configured to inject a DC current across the p-n junction in the amplification sections.

23. The semiconductor laser according to claim 13, wherein the one or more modulation sources comprise at least one AC current source configured to inject a modulated current across the p-n junction in the modulation sections.

24. The semiconductor laser of claim 23, wherein the modulated current differs from one modulation section to another.

25. The semiconductor laser according to claim 13, wherein the one or more modulation sources comprise at least one AC voltage source applying a modulated voltage across the p-n junction in the modulation sections.

26. The semiconductor laser according to claim 13, wherein the load resistor has an adjustable resistance value.

27. The semiconductor laser according to claim 26, further commprising an electronic circuit configured to measure a voltage and a current across the load resistor and to produce a signal to adjust the resistance value of the load resistor.

28. The semiconductor laser according to claim 24, wherein the photovotaic mode element comprises a DC voltage source.

29. The semiconductor laser according to claim 24, wherein the photovoltaic mode element comprises a DC current source.

30. The semiconductor laser according to claim 13, comprising a single modulation section.

31. The semiconductor laser according to claim 13, comprising a single amplification section.

32. The semiconductor laser according to claim 13, comprising at least two amplification sections.

* * * * *